United States Patent
Kim et al.

(10) Patent No.: US 11,552,494 B2
(45) Date of Patent: *Jan. 10, 2023

(54) METHOD AND APPARATUS CONTROLLING CHARGING OF BATTERY BASED ON DIFFUSION CHARACTERISTICS OF MATERIAL INCLUDED IN THE BATTERY

(71) Applicant: Samsung Electronics Co., Ltd., Suwon-si (KR)

(72) Inventors: Jinho Kim, Yongin-si (KR); Tae Won Song, Yongin-si (KR); Ju Wan Lim, Suwon-si (KR); Young Hun Sung, Hwaseong-si (KR); Hongsoo Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 169 days.

This patent is subject to a terminal disclaimer.

(21) Appl. No.: 17/134,586

(22) Filed: Dec. 28, 2020

(65) Prior Publication Data

US 2021/0119464 A1   Apr. 22, 2021

Related U.S. Application Data

(63) Continuation of application No. 16/034,528, filed on Jul. 13, 2018, now Pat. No. 10,886,767.

(30) Foreign Application Priority Data

Feb. 12, 2018 (KR) .................. 10-2018-0017269

(51) Int. Cl.
*H02J 7/00* (2006.01)
*H01M 10/42* (2006.01)
(Continued)

(52) U.S. Cl.
CPC ...... *H02J 7/007188* (2020.01); *G01R 31/382* (2019.01); *H01M 10/425* (2013.01);
(Continued)

(58) Field of Classification Search
CPC .............. H01M 10/484; H01M 10/44; H01M 10/486; H01M 10/425
See application file for complete search history.

(56) References Cited

U.S. PATENT DOCUMENTS 9,071,071 B2    6/2015  Greening et al.
10,886,767 B2*  1/2021  Kim ................... H02J 7/0071
(Continued)

FOREIGN PATENT DOCUMENTS

CN    102593536 A    7/2012
JP    2012-5341 A    1/2012
(Continued)

OTHER PUBLICATIONS

Rahimian, Saeed K., et al., "Optimal charge rates for a lithium ion cell", *Journal of Power Sources*, 2011, pp. 10297-10304.
Extended European Search Report dated Jul. 8, 2019 in counterpart European Patent Application No. 18211871.1.

*Primary Examiner* — David V Henze-Gongola
(74) *Attorney, Agent, or Firm* — NSIP Law

(57) ABSTRACT

A battery charging control method and apparatus is disclosed. The battery charging control method includes inputting a preset magnitude of a current to a battery during a preset period of time, identifying a diffusion characteristic of a material in the battery, and determining whether to change the magnitude of the current to be input to the battery based on the identified diffusion characteristic of the material, in which the diffusion characteristic may be determined based on a distribution of the material in one or more of a cathode of the battery, an anode of the battery, and an electrolyte of
(Continued)

the battery in response to the input of the current in the battery.

18 Claims, 8 Drawing Sheets

(51) Int. Cl.
*H01M 10/48* (2006.01)
*H01M 10/44* (2006.01)
*G01R 31/382* (2019.01)

(52) U.S. Cl.
CPC ......... *H01M 10/44* (2013.01); *H01M 10/484* (2013.01); *H01M 10/486* (2013.01); *H02J 7/00* (2013.01); *H02J 7/0071* (2020.01); *H01M 2010/4271* (2013.01)

(56) References Cited

U.S. PATENT DOCUMENTS

| | | |
|---|---|---|
| 2009/0273320 A1 | 11/2009 | Ungar et al. |
| 2014/0002031 A1 | 1/2014 | Chaturvedi et al. |
| 2015/0022157 A1 | 1/2015 | Takahashi |
| 2016/0023566 A1 | 1/2016 | Lee |
| 2016/0023569 A1* | 1/2016 | Lee .................. H01M 10/48 429/61 |
| 2016/0087461 A1* | 3/2016 | Greening ............ H01M 10/44 320/107 |

FOREIGN PATENT DOCUMENTS

| | | |
|---|---|---|
| JP | 2013-44598 A | 3/2013 |
| JP | 2014-56778 A | 3/2014 |
| JP | 2015-208061 A | 11/2015 |
| KR | 10-1088570 B1 | 12/2011 |
| KR | 10-2016-0062886 A | 6/2016 |

* cited by examiner

600

METHOD AND APPARATUS CONTROLLING CHARGING OF BATTERY BASED ON DIFFUSION CHARACTERISTICS OF MATERIAL INCLUDED IN THE BATTERY

CROSS-REFERENCE TO RELATED APPLICATIONS

This application is a continuation application of U.S. application Ser. No. 16/034,528, filed on Jul. 13, 2018, which claims the benefit under 35 USC § 119(a) of Korean Patent Application No. 10-2018-0017269 filed on Feb. 12, 2018, in the Korean Intellectual Property Office, the entire disclosure of which is incorporated herein by reference for all purposes.

BACKGROUND

1. Field

The following description relates to a battery management method, apparatus, and system (BMS) managing a battery.

2. Description of Related Art

A battery is used as a power source for various devices and systems including, for example, mobile devices and electric vehicles, and various methods for charging a battery have been proposed. For example, a constant current-constant voltage (CCCV) based charging method is generally used to charge a battery with a constant current until a certain voltage is reached, and to charge the battery with a constant voltage until a preset low current is reached. In another example, a multistep charging method is used to charge a battery with a constant current in various steps while reducing a magnitude of a current, and a pulse charging method is used to repeatedly apply a pulse current to the battery in a short time unit. It is beneficial for users of the battery to know when the battery is fully charged and when the battery may exhaust its available power.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a battery charging control method includes inputting a preset magnitude of a current to a battery during a preset period of time, identifying a current diffusion characteristic of a material in the battery and determining whether to change the magnitude of the current to be input to the battery based on the identified diffusion characteristic of the material, wherein the diffusion characteristic is determined based on a predetermined distribution of the material in one or more of a cathode of the battery, an anode of the battery, and an electrolyte of the battery in response to the input of the current to the battery.

Diffusion characteristics of the material vary for varying currents input to the battery.

The diffusion characteristic comprises a charging speed coefficient that is determined based on at least one or more of: a cathode diffusion coefficient that indicates a diffusion characteristic of the material in the cathode of the battery based on a concentration of the material in the cathode and a temperature of the material in the cathode; an anode diffusion coefficient that indicates a diffusion characteristic of the material in the anode of the battery based on a concentration of the material in the anode, and a temperature of the material in the anode; and an electrolyte diffusion coefficient that indicates a diffusion characteristic of the material in the electrolyte of the battery based on a concentration of the material in the electrolyte and a temperature of the material in the electrolyte.

The charging speed coefficient is determined by combining the cathode diffusion coefficient, the anode diffusion coefficient, and the electrolyte diffusion coefficient based on respective weight factors that correspond to each of the cathode diffusion coefficient, the anode diffusion coefficient, and the electrolyte diffusion coefficient.

The charging speed coefficient is a smaller coefficient among the cathode diffusion coefficient, the anode diffusion coefficient, and the electrolyte diffusion coefficient.

The determining to change the magnitude of the current includes determining to change the magnitude of the current to be input to the battery based on an increment of the charging speed coefficient in response to the charging speed coefficient increasing in response to the current being input to the battery during the preset period of time.

The battery charging control method includes comparing, to a preset threshold, a state variable of the battery that is identified by an electrochemical model simulating a state of the battery; decreasing the magnitude of the current to be input to the battery in response to the state variable exceeding the preset threshold; and storing a charging speed coefficient corresponding to the decreased magnitude of the current.

The charging speed coefficient is determined by combining the cathode diffusion coefficient, the anode diffusion coefficient, and the electrolyte diffusion coefficient based on a weight factor that corresponds to each of the cathode diffusion coefficient, the anode diffusion coefficient, and the electrolyte diffusion coefficient.

The identifying of the diffusion characteristic of the material includes identifying the diffusion characteristic based on an electrochemical model that simulates a state of the battery based on at least one or more of the current, a state of charge (SOC) of the battery, and a state of health (SOH) of the battery.

In another general aspect, a battery charging control method includes determining a current diffusion characteristic of a material in a battery; and charging the battery by adjusting a magnitude of a current to be input to the battery based on the determined diffusion characteristic, wherein the diffusion characteristic indicates a distribution of the material that changes based on the current to be input to the battery.

The determining the diffusion characteristic of the material includes determining of the diffusion characteristic based on at least one or more of: a cathode diffusion coefficient that indicates a diffusion characteristic of the material in a cathode of the battery based on a concentration of the material in the cathode of the battery and a temperature of the material in the cathode of the battery; an anode diffusion coefficient that indicates a diffusion characteristic of the material in an anode of the battery based on a concentration of the material in the anode of the battery and a temperature of the material in the anode of the battery; or an electrolyte diffusion coefficient that indicates a diffusion characteristic of the material in an electrolyte of the battery based on a concentration of the material in the electrolyte of the battery and a temperature of the material in the electrolyte of the battery.

The determining the diffusion characteristic includes determining the diffusion characteristic based on a charging speed coefficient obtained by combining the cathode diffusion coefficient, the anode diffusion coefficient, and the electrolyte diffusion coefficient based on a weight factor corresponding to each of the cathode diffusion coefficient, the anode diffusion coefficient, and the electrolyte diffusion coefficient.

The determining the diffusion characteristic includes determining the diffusion characteristic based on a smallest coefficient among the cathode diffusion coefficient, the anode diffusion coefficient, and the electrolyte diffusion coefficient.

The charging the battery includes adjusting the magnitude of the current based on a speed of the material diffusing in a cathode, an anode, or an electrolyte of the battery, which is estimated from the diffusion characteristic.

The charging of the battery includes determining whether to adjust the magnitude of the current based on an electrochemical model that simulates a state of the battery based on the determined diffusion characteristic.

The battery charging method includes changing the electrochemical model based on a variation in the magnitude of the current in response to a determination to adjust the magnitude of the current.

In another general aspect, a battery charging control apparatus includes a processor configured to adjust a magnitude of a current to be input to a battery, and change the magnitude of the current input to the battery and a parameter based on a determined diffusion characteristic that indicates a distribution of a material in one or more of a cathode of the battery, an anode of the battery, and an electrolyte of the battery in response to the input of the current to the battery.

The diffusion characteristic is determined based on at least one or more of a cathode diffusion coefficient that indicates a diffusion characteristic of the material in the cathode of the battery based on a concentration of the material in the cathode of the battery and a temperature of the material in the cathode of the battery; an anode diffusion coefficient that indicates a diffusion characteristic of the material in the anode of the battery based on a concentration of the material in the anode of the battery and a temperature of the material in the anode of the battery; or an electrolyte diffusion coefficient that indicates a diffusion characteristic of the material in the electrolyte of the battery based on a concentration of the material in the electrolyte of the battery and a temperature of the material in the electrolyte of the battery.

The processor is further configured to determine the diffusion characteristic based on a charging speed coefficient obtained by combining the cathode diffusion coefficient, the anode diffusion coefficient, and the electrolyte diffusion coefficient based on a weight factor corresponding to each of the cathode diffusion coefficient, the anode diffusion coefficient, and the electrolyte diffusion coefficient.

The processor is further configured to determine the diffusion characteristic based on a smallest coefficient among the cathode diffusion coefficient, the anode diffusion coefficient, and the electrolyte diffusion coefficient.

The parameter comprises at least one of an overpotential distribution of the battery, a voltage of the battery, a state of charge (SOC) of the battery, or a state of health (SOH) of the battery.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
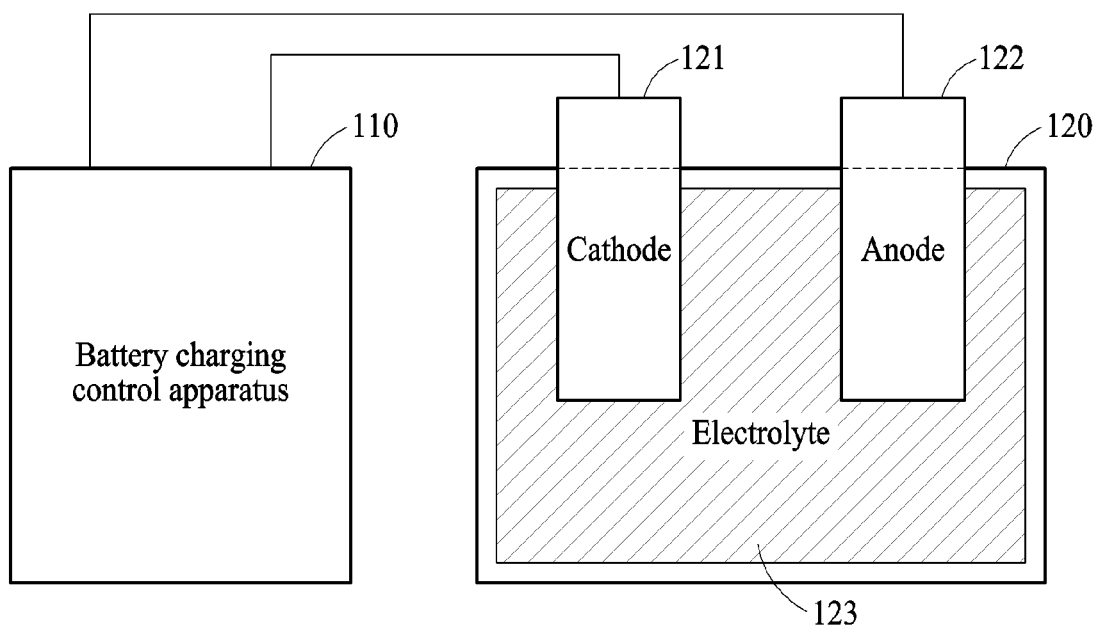
FIG. 1 is a diagram illustrating an example of a battery system.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof.

In addition, terms such as first, second, A, B, (a), (b), and the like may be used herein to describe components. Each of these terminologies is not used to define an essence, order, or sequence of a corresponding component but used merely to distinguish the corresponding component from other component(s).

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. Likewise, expressions, for example, "between" and "immediately between" and "adjacent to" and "immediately adjacent to" may also be construed as described in the foregoing.

Unless otherwise defined, all terms, including technical and scientific terms, used herein have the same meaning as commonly understood by one of ordinary skill in the art to which this disclosure pertains consistent with and after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Examples described herein may be embodied by various types of products, such as, for example, a personal computer (PC), a laptop computer, a tablet PC, a smartphone, a television (TV), a smart home appliance, an intelligent vehicle, a kiosk, a wearable device, and the like. The examples may be applied to user verification or authentication in, for example, a smartphone, a mobile device, a smart home system, and the like. The examples may also be applied to payment services through user verification or authentication. Further, the examples may also be applied to an intelligent vehicle system that automatically starts through user verification or authentication. Hereinafter, the examples will be described in detail with reference to the accompanying drawings. Regarding the reference numerals assigned to the elements in the drawings, it should be noted that the same elements will be designated by the same reference numerals, wherever possible, even though they are shown in different drawings.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

It is noted that use of the term "may" with respect to an example or embodiment, e.g., as to what an example or embodiment may include or implement, means that at least one example or embodiment exists where such a feature is included or implemented while all examples and embodiments are not limited thereto.

FIG. 1 is a diagram illustrating an example of a battery system 100.

Referring to FIG. 1, the battery system 100 includes a battery charging control apparatus 110 and a battery 120. The battery 120 may be a battery cell, a battery module, or a battery pack, but is not limited thereto. The battery 120 may include a storage battery or a secondary battery configured to store power based on the receipt of a charge, and an apparatus or device employing the battery 120 may obtain or receive power from the battery 120 and apply the received power to a load. In an example, the battery system 100 is embedded in, or represented by such a device or apparatus such as the vehicle 710 in FIG. 7. As illustrated in FIG. 1, the battery 120 includes, as main components, a cathode 121, an anode 122, and an electrolyte 123, for example. The battery 120 may also include other components that are not illustrated in FIG. 1. The structures and positions of the cathode 121, the anode 122, and the electrolyte 123 that are illustrated in FIG. 1 are provided for the convenience of description, and thus the structures and positions of the various components of the battery 120 may vary according to various examples. The battery 120 may be one of a lithium-ion (Li-ion) battery, a Li-ion polymer battery, a lead storage battery, a nickel-cadmium (NiCd) battery, and a nickel-metal hydride (NiMH) storage battery, but is not limited thereto.

The battery charging control apparatus 110 included in the battery system 100 may adjust a magnitude of a current to be input to the battery 120, and thus control a charging speed of the battery 120 or a state of charge (SOC) of the battery 120. The SOC refers to a parameter indicating the charging level or charging state of the battery 120. The SOC simply indicates a remaining amount of energy stored in the battery 120, which is indicated by a unit of percent (%) from 0 to 100%. For example, 0% indicates a fully discharged battery state, and 100% indicates a fully charged battery state. Examples exist with the charging indication unit being variously defined. Additionally, various methods such as the pressure method, Kalman filtering, the Coulomb method, and the chemical method may be used to estimate or measure the SOC.

The battery charging control apparatus 110 may also monitor the state of health (SOH) of the battery 120. The SOH refers to the amount of energy that the battery 120 is capable of holding. While the SOC may be modified by the value of polarization currents, the SOH may be defined on the basis of the age of the battery. In other words, the SOH decreases as the age of the battery increases.

The battery charging control apparatus 110 may be embodied by a battery management system (BMS). The BMS refers to a system that manages the battery 120 and may perform, for example, at least one of an operation of monitoring a state of charge or state of health of the battery 120, an operation of maintaining an optimized condition of the battery 120, an operation of predicting when to replace the battery 120 based on a determination of the lifespan of the battery 120, an operation of discovering a problem with the battery 120, or an operation of controlling a state or an operation of the battery 120 by generating a control or command signal for the battery 120.

The battery charging control apparatus 110 may control a conversion between chemical energy and electrical energy that occurs in the battery 120 by adjusting the magnitude of the current to be input to the battery 120. Herein, discharging of the battery 120 may indicate a conversion of energy from chemical energy to electric energy that occurs in the battery 120. For example, lithium may be an active material that causes a chemical reaction in the battery 120. In this example, when the battery 120 is discharged, a chemical reaction wherein a lithium ion Li+ and an electron e− are discharged from the anode 122 may occur on a boundary surface between the anode 122 and the electrolyte 123 of the battery 120. The discharged lithium ion Li+ may pass through the electrolyte 123 and then move to a boundary surface between the cathode 121 and the electrolyte 123. Additionally, a chemical reaction wherein a lithium ion L+ and an electron e− are absorbed into the cathode 121 may occur on the boundary surface between the cathode 121 and the electrolyte 123.

Charging of the battery 120 may indicate a conversion of energy from electrical energy to chemical energy that occurs in the battery 120. When the battery 120 is charged, the chemical reaction of the lithium ion Li+ and the electron e− may be reversed, that is, a reverse chemical reaction may occur. For example, the chemical reaction wherein the lithium ion Li+ and the electron e− are discharged from the cathode 121 may occur on the boundary surface between the cathode 121 and the electrolyte 123. The discharged lithium ion Li+ may pass through the electrolyte 123 and then move to the boundary surface between the anode 122 and the electrolyte 123. Also, the chemical reaction wherein the lithium ion Li+ and the electron e− are absorbed into the anode 122 may occur on the boundary surface between the anode 122 and the electrolyte 123. The speed of the chemical reaction occurring on the boundary surface between the cathode 121 and the electrolyte 123 and on the boundary surface between the anode 122 and the electrolyte 123 may be determined based on the magnitude of a current to be input to the cathode 121 to charge the battery 120.

While the battery 120 is being charged, the battery charging control apparatus 110 may determine the magnitude of the current to be input to the cathode 121 based on a movement of the lithium ion Li+ or the electron e−. For example, the battery charging control apparatus 110 may determine the magnitude of the current to be input to the cathode 121 based on a speed at which the lithium ion L+ or the electron e− moves or diffuses to the boundary surface between the cathode 121 and the electrolyte 123, and a speed at which the lithium ion Li+ or the electron e− moves or diffuses to the boundary surface between the anode 122 and the electrolyte 123.

The current to be input to the cathode 121 by the battery charging control apparatus 110, or a charging current, may be indicated in various ways using a unit of, for example, ampere (A), milliampere (mA), and the like. Alternatively, the charging current may also be indicated as a current rate (C-rate). The C-rate may represent a battery-related characteristic indicative of a charging and discharging rate of a current based on a battery capacity, and may generally use a unit of [C]. For example, in a case in which a battery capacity corresponding to an amount of a current available for one hour is 1000 milliampere hour (mAh) and a charging and discharging current is 1 A, C-rate may be represented as 1 C=1 A/1000 mAh.

The battery charging control apparatus 110 may estimate an internal state of the battery 120 and control a charging speed or an SOC of the battery 120 based on the estimated internal state. In other words, the battery charging control apparatus 110 may determine the amount of charge that the battery 120 is currently capable of holding (the SOH of the battery) and control the speed that the battery 120 would be charged based on the determined SOH. The battery charging control apparatus 110 may estimate the internal state of the battery (the SOH) 120 based on an electrochemical model.

The electrochemical model may simulate a state of the battery 120, or a chemical reaction, in particular, that may cause a conversion between electric energy and chemical energy in the battery 120. The battery charging control apparatus 110 may estimate the internal state of the battery 120 by inputting, to the electrochemical model, a parameter that may be measured in real time from the battery 120. The parameter may be, for example, a potential difference between the cathode 121 and the anode 122, a magnitude of current flow in the battery 120, or a magnitude of a current to be output from the battery 120, but is not limited thereto. The battery charging control apparatus 110 may include a memory configured to store such a parameter associated with the electrochemical model.

While the battery 120 is being charged, the battery charging control apparatus 110 may adjust a magnitude of a current to be input to the battery 120 based on the electrochemical model. For example, the battery charging control apparatus 110 may estimate the distribution of a material, for example, an active material, included in the battery 120 in the cathode 121, the anode 122, or the electrolyte 123 based on the electrochemical model. The estimated distribution of the material in the cathode 121, the anode 122, or the electrolyte 123 may be used to determine a diffusion characteristic of the material in the cathode 121, the anode 122, or the electrolyte 123. The diffusion characteristic in each of the cathode 121, the anode 122, and the electrolyte 123 may indicate a characteristic of a distribution or a movement of the material in each of the cathode 121, the anode 122, and the electrolyte 123 of the battery 120. The determined diffusion characteristic may be used to adjust the magnitude of the current to be input to the battery 120. The battery charging control apparatus 110 may adjust the magnitude of the current to be input to the battery 120 based on a charging speed coefficient generated from the diffusion characteristic and the state of health of the battery 120.

Figure 2:
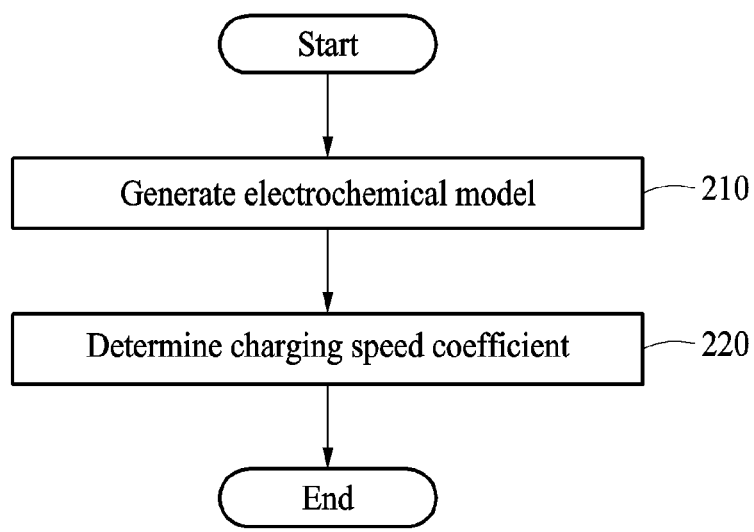
FIG. 2 is a flowchart illustrating an example of a method of generating an electrochemical model of a battery charging control apparatus and determining a charging speed coefficient.

FIG. 2 is a flowchart illustrating an example of a method of determining an electrochemical model used in a battery charging control apparatus and a charging speed coefficient. The operations in FIG. 2 may be performed in the sequence and manner as shown, although the order of some operations may be changed or some of the operations omitted without departing from the spirit and scope of the illustrative examples described. Many of the operations shown in FIG. 2 may be performed in parallel or concurrently. One or more blocks of FIG. 2, and combinations of the blocks, can be implemented by special purpose hardware-based computer that perform the specified functions, or combinations of special purpose hardware and computer instructions.

With regard to the discussion pertaining to FIG. 2, references to the cathode, anode, and electrolyte may refer to the cathode 121, anode 122, and electrolyte 123 as illustrated in FIG. 1.

Referring to FIG. 2, in operation 210, an electrochemical model simulating a chemical reaction in a battery is generated. The electrochemical model may be obtained in, for example, during the manufacturing of the battery. A fundamental variable or constant that is used to generate the electrochemical model or that is included in the electrochemical model may be obtained through experiments performed on the battery. The fundamental variable or constant included in the electrochemical model may include factors such as, for example, a thickness of each of a cathode, an anode, and a separation membrane of the battery, an amount of an active material or composition of each of the cathode and the anode, an ion conductivity of an electrolyte of the battery, an electrical conductivity of each of the cathode and the anode, an initial concentration of the electrolyte, a composition ratio of the active material of each of the cathode and the anode.

In an example, a diffusion characteristic of a material included in the cathode, the anode, or the electrolyte of the battery may be obtained through experiments performed on the battery. The diffusion characteristic of the material in the cathode, the anode, or the electrolyte may be determined based on a temperature in each of the cathode, the anode, and the electrolyte, or a concentration of the material in each of the cathode, the anode, and the electrolyte. That is, the diffusion characteristic of the material in the cathode, the anode, and the electrolyte may be determined based on a relationship between a temperature in a corresponding position and a concentration of the material in the corresponding position.

The diffusion characteristic obtained through various experiments performed on the battery may be used to determine a cathode diffusion coefficient indicating a characteristic of the material diffusing in the cathode of the battery based on the concentration and the temperature of the material in the cathode, an anode diffusion coefficient indicating a characteristic of the material diffusing in the anode of the battery based on the concentration and the temperature of the material in the anode, and an electrolyte diffusion coefficient indicating a characteristic of the material diffusing in the electrolyte based on the concentration and the temperature of the material in the electrolyte. Herein, the temperature of the material in each of the cathode, the anode, and the electrolyte may refer to a temperature at which the material in each of the cathode, the anode, and the electrolyte is dissolved.

By charging or discharging the battery with different temperatures or C-rates of the battery, a relationship between the current and the voltage of the battery based on a temperature or a C-rate may be obtained. The obtained relationship between the current and the voltage of the battery based on the temperature or the C-rate, the obtained fundamental variable or constant, and the obtained diffusion characteristic may be used to generate the electrochemical model. When a parameter measured in real time from the battery is received as a parameter associated with the battery, the electrochemical model generated in operation 210 may output a parameter associated with an internal state of the battery (120, FIG. 1) in response to the received parameter.

The internal state of the battery that may be estimated through the electrochemical model may include at least one of, for example, a cathode overpotential, an anode overpotential, a cathode surface lithium ion concentration, an anode surface lithium ion concentration, a cell voltage condition, an SOC, an SOH, or an internal temperature distribution.

As an example, an overpotential may indicate a voltage drop that may be caused by a deviation from an equilibrium potential associated with an insertion or elimination reaction at each electrode of the battery. The SOH may be a parameter indicating a quantitative change in a life of the battery due to an aging effect of the battery, or a degradation phenomenon, that occurs in the battery, and may indicate, for example, an extent to which the state of the battery is degraded in terms of its lifespan or capacity. The SOH may be used to change the parameter included in the electrochemical model.

As an example, the internal state of the battery that may be estimated through the electrochemical model may include the diffusion characteristic of the material included in the main components of the battery, for example, the cathode, the anode, and the electrolyte. The diffusion characteristic may include a cathode diffusion coefficient indicating a characteristic of the material moving in the cathode of the battery based on a concentration of the material in the cathode and a temperature of the material in the cathode, an anode diffusion coefficient indicating a characteristic of the material moving in the anode of the battery based on a concentration of the material in the anode and a temperature of the material in the anode, and an electrolyte diffusion coefficient indicating a characteristic of the material moving in the electrolyte of the battery based on a concentration of the material in the electrolyte and a temperature of the material in the electrolyte.

The cathode diffusion coefficient, the anode diffusion coefficient, and the electrolyte diffusion coefficient may each be a function associated with the temperature of the anode, cathode, and electrolyte, and the material of the anode, cathode, and electrolyte. The material may be, for example, lithium ion which is an active material. A distribution of the material concentrations in the cathode, the anode, and the electrolyte, and a distribution of the temperatures in the cathode, the anode, and the electrolyte may be determined based on a magnitude of a current to be input to the battery. The cathode diffusion coefficient, the anode diffusion coefficient, and the electrolyte diffusion coefficient may be determined by optimizing the diffusion characteristic of the material in each position, for example, in each of the cathode, the anode, and the electrolyte, that is obtained through the experiment. The cathode diffusion coefficient, the anode diffusion coefficient, and the electrolyte diffusion coefficient may be used to control charging of the battery.

In operation 220, a charging speed coefficient is determined based on the generated electrochemical model. The charging speed coefficient may be determined based on a change in the cathode diffusion coefficient, the anode diffusion coefficient, and the electrolyte diffusion coefficient, which are based on an SOC that is obtained with the electrochemical model. The charging speed coefficient may be determined based on an influence of each of the cathode diffusion coefficient, the anode diffusion coefficient, and the electrolyte diffusion coefficient on a restriction condition of a state variable, which is a parameter indicating the internal state of the battery. The restriction condition may be a condition that is needed to charge the battery while preventing degradation of the battery. The restriction condition may restrict a magnitude of a current to be input to the battery so that the magnitude of current that is inputted to the battery does not result in degradation of the battery. The restriction condition may be based on the state variable determined to correspond to the magnitude of the current to be input to the battery to charge the battery.

For example, in a case in which the cathode diffusion coefficient, the anode diffusion coefficient, and the electrolyte diffusion coefficient are different from each other while the battery is being charged, the material, for example, an active material, associated with the diffusion coefficients may be accumulated on the surface of the cathode or the surface of the anode. The material accumulated on the surface of the cathode or the surface of the anode may cause a chemical reaction, or a side reaction, that hinders the charging of the battery. Herein, the restriction condition may be determined to prevent such a side reaction. The restriction condition may be set based on, for example, an overpotential that may cause degradation of the battery, or a concentration of the active material.

A time at which the battery reaches the restriction condition may vary based on a change in each of the cathode diffusion coefficient, the anode diffusion coefficient, and the electrolyte diffusion coefficient. In an example, the charging speed coefficient may be determined based on a sensitivity of the restriction condition to each of the cathode diffusion coefficient, the anode diffusion coefficient, and the electrolyte diffusion coefficient. The sensitivity of the restriction condition may be determined based on an amount of time used for at least one of an overpotential of the battery or a concentration of the active material to satisfy the restriction condition when changing one of the cathode diffusion coefficient, the anode diffusion coefficient, and the electrolyte diffusion coefficient. The sensitivity or the time required for reaching the restriction condition may be used to determine a weight factor to be applied to each of the cathode diffusion coefficient, the anode diffusion coefficient, and the electrolyte diffusion coefficient.

In an example, the charging speed coefficient may be determined by combining the cathode diffusion coefficient, the anode diffusion coefficient, and the electrolyte diffusion coefficient based on a weight factor corresponding to each of the cathode diffusion coefficient, the anode diffusion coefficient, and the electrolyte diffusion coefficient. For example, the charging speed coefficient may be determined as represented by Equation 1 below.

Charging speed coefficient=$wf1$×cathode diffusion coefficient(concentration, temperature)+$wf2$× electrolyte diffusion coefficient(concentration, temperature)+$wf3$×anode diffusion coefficient (concentration,temperature)  Equation 1

In Equation 1, wf1, wf2, and wf3 each denote a weight factor corresponding to a cathode diffusion coefficient, an electrolyte diffusion coefficient, and an anode diffusion coefficient, respectively. For example, a time used for reaching the restriction condition of the battery that is measured by increasing or decreasing the anode diffusion coefficient is less than a time used for reaching the restriction condition of the battery that is measured by increasing or decreasing the remaining diffusion coefficients, wf3 may be determined to be greater than wf1 and wf2. That is, a diffusion coefficient that is highly related to the restriction condition among the cathode diffusion coefficient, the anode diffusion coefficient, and the electrolyte diffusion coefficient may affect the charging speed coefficient.

In another example, the charging speed coefficient may be determined to be the smallest diffusion coefficient among the cathode diffusion coefficient, the anode diffusion coefficient, and the electrolyte diffusion coefficient. As described above, the side reaction that occurs when an active material accumulates on the surface of the cathode or the surface of the anode may occur when the material in the battery is accumulated in a position in the battery that has a low diffusion coefficient, for example, on the surface of the cathode or the surface of the anode. The side reaction may be related to degradation of the battery and a charging speed of the battery, and the charging speed coefficient may thus be determined based on a diffusion coefficient corresponding to a position in which the side reaction occurs. For example, the charging speed coefficient may be determined as represented by Equation 2 below.

Charging speed coefficient=min[cathode diffusion coefficient(concentration,temperature), electrolyte diffusion coefficient(concentration,temperature), anode diffusion coefficient(concentration, temperature)]  Equation 2

Since lengths, sizes, or volumes of the cathode, the anode, and the electrolyte of the battery may differ, the cathode diffusion coefficient, the anode diffusion coefficient, and the electrolyte diffusion coefficient that are included in Equation 2 may be normalized so that they are not affected by a length, a size, or a volume of each of the cathode, the anode, and the electrolyte. For example, each of the cathode diffusion coefficient, the anode diffusion coefficient, and the electrolyte diffusion coefficient may be divided by a square of each of the lengths of the cathode, the anode, and electrolyte, respectively.

The determined charging speed coefficient may be included as part of the electrochemical model. According to an example, the battery charging control apparatus may adjust a magnitude of a current to be input to the battery based on the restriction condition and the charging speed coefficient that are obtained from the electrochemical model. Thus, the battery charging control apparatus may control the battery charging speed according to an internal state of the battery that affects the charging of the battery in addition to a voltage of the battery. For example, the battery charging control apparatus may calculate, in real time, a charging speed coefficient corresponding to a current state of the battery, and then adjust a magnitude of a current to be input to the battery based on the calculated charging speed coefficient.

Figure 3A:
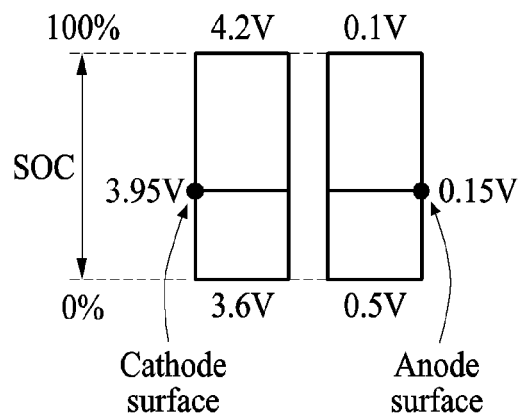
FIGS. 3A, 3B, and 3C are graphs illustrating examples of a potential distribution in a cathode and an anode of a battery included in a battery charging control apparatus.
Figure 3B:
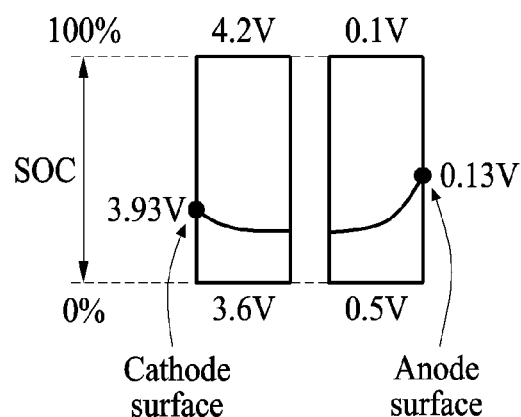
Figure 3C:
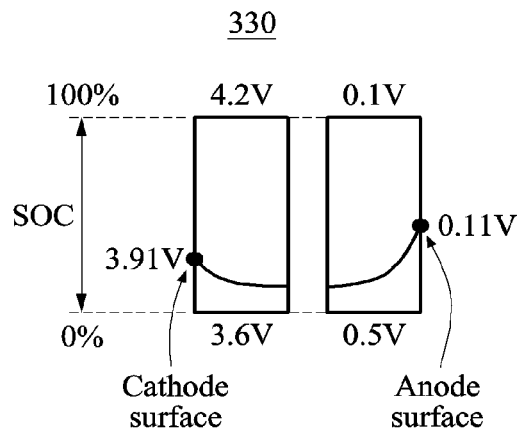

FIGS. 3A, 3B, and 3C are graphs illustrating examples of a potential distribution in a cathode and an anode of a battery included in a battery charging control apparatus. As an example, the cathode may refer to the cathode 121 in FIG. 1, the anode may refer to the anode 122 in FIG. 1, and the electrolyte may refer to the electrolyte 123 in FIG. 1.

FIGS. 3A, 3B, and 3C are graphs 310, 320, and 330, respectively, illustrating an internal position in a cathode and an anode of a battery on an x axis and with a potential or an SOC on a y axis. In the respective graphs 310, 320, and 330, a potential on a cathode surface of the battery and a potential on an anode surface of the battery are indicated. Herein, the cathode surface and the anode surface each indicates a surface of the cathode or anode that is exposed to the outside of the battery, or a surface of the anode or cathode to which an external load is connected. In the respective graphs 310, 320, and 330, a terminal voltage of the battery, or a potential difference between the cathode surface and the anode surface, is 3.8 volts (V).

Referring to FIG. 3A, the graph 310 indicates examples of potential distributions in the cathode and the anode of the battery when the battery is in an open-circuit voltage (OCV) state in which charging and discharging is not performed. In the OCV state, the potential distributions may be uniform in both the cathode and the anode. That is, the potential distributions in the cathode and the anode of the battery may not change based on a distance between the cathode surface and the anode surface.

FIGS. 3B and 3C are the respective graphs 320 and 330 indicating examples of potential distributions in the cathode and the anode of the battery at different SOCs and C-rates. Referring to FIG. 3B, the graph 320 indicates a potential distribution in the cathode and the anode of the battery when the battery is charged with 1.0 C-rate in an SOC of 29%. An SOC of 29% means that the battery is at 29% of full capacity. Referring to FIG. 3C, the graph 330 indicates a potential distribution in the cathode and the anode of the battery when the battery is charged with 4.0 C-rate in an SOC of 19%.

By comparing the graph 310 and the respective graphs 320 and 330, the potential distributions in the cathode and the anode of the battery may not be uniform while the battery is being charged. The potential distribution in the cathode of the battery may be relatively high on the cathode surface of the battery and lowered as a distance from the cathode surface increases. Also, the potential distribution in the anode of the battery may be relatively high on the anode surface of the battery and lowered as a distance from the anode surface increases.

By comparing the graph 320 and the graph 330, although the terminal voltage of the battery is the same, the potential distributions in the cathode and the anode of the battery may be different based on an SOC of the battery and the charging rate of the battery. Additionally, the potential distributions in the cathode and the anode of the battery may be different based on a C-rate of the battery. The potential distribution in each of the cathode and the anode of the battery may affect a chemical reaction that may occur in the cathode and the anode of the battery. That is, the potential distributions in the cathode and the anode of the battery may affect a cathode diffusion coefficient and an anode diffusion coefficient, respectively. The potential distributions in the cathode and the anode of the battery may be different based on an SOC and a C-rate, and thus the cathode diffusion coefficient and the anode diffusion coefficient may be determined differently based on an SOC and a C-rate of the battery.

Figure 4A:
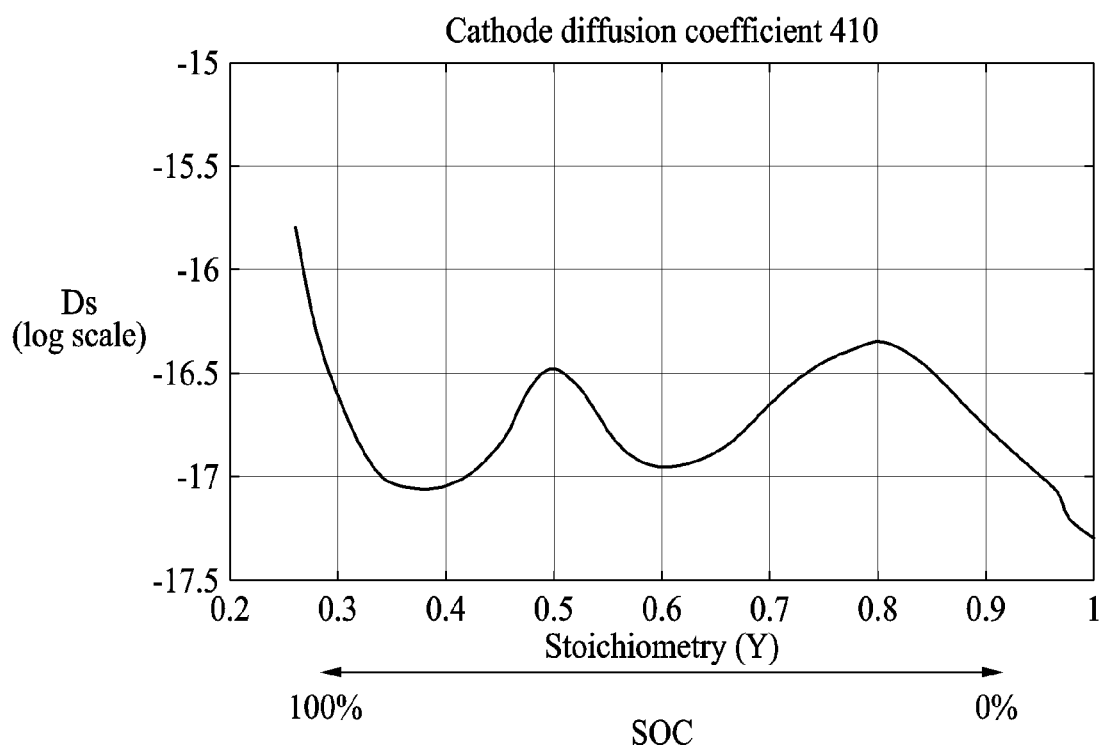
FIGS. 4A and 4B are graphs illustrating an example of a cathode diffusion coefficient and an example of an anode diffusion coefficient, respectively, of a battery included in a battery charging control apparatus.
Figure 4B:
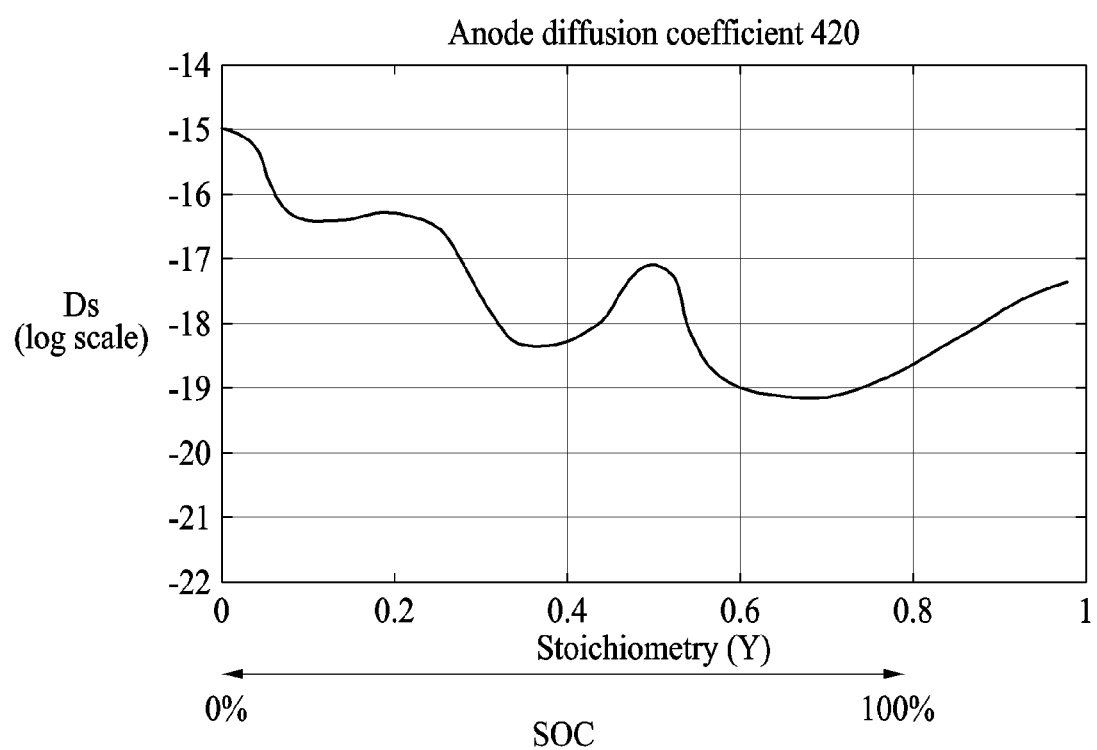

FIG. 4A is a graph 410 illustrating an example of a cathode diffusion coefficient based on an SOC of a battery included in a battery charging control apparatus while a battery is being charged, and FIG. 4B is a graph 420 illustrating an example of an anode diffusion coefficient based on an SOC of a battery included in a battery charging control apparatus while the battery is being charged.

Referring to FIGS. 4A and 4B, by comparing the graph 410 and the graph 420, the cathode diffusion coefficient and the anode diffusion coefficient are different in the same SOC. Additionally, a relatively smaller diffusion coefficient between the two coefficients in each SOC changes. For example, as illustrated, when an SOC is near to 0%, the cathode diffusion coefficient has a relative value smaller than that of −17 and is thus smaller than the anode diffusion coefficient having a relative value between −15 and −17, in the same SOC. However, when an SOC is near to 100%, the cathode diffusion coefficient has a relative value between −16.5 and −17 and is thus greater than the anode diffusion coefficient having a relative value between −18 and −19, in the same SOC. In addition, as the SOC changes from 0% to 100%, the cathode diffusion coefficient changes at a greater rate than the anode diffusion coefficient does.

As described above, a side reaction may occur when a material in a battery is accumulated in a position in the battery, for example, a position in which a chemical reaction is relatively slow. According to an example embodiment, the battery charging control apparatus may identify such a position in which a chemical reaction proceeds relatively slowly based on a change in a cathode diffusion coefficient, a change in an anode diffusion coefficient, and a change in an electrolyte diffusion coefficient based on an SOC, as shown in the graphs 410 and 420. Further, the battery charging control apparatus may adjust a magnitude of a current to be input to the battery based on a speed of the chemical reaction in the identified position, for example, a speed of the material diffusing in the identified position. Thus, the battery charging control apparatus may adjust the speed of the chemical reaction occurring in the battery, for example, a speed of a chemical reaction of converting electric energy to chemical energy. By adjusting the magnitude of the current to be input to the battery, the battery charging control apparatus may thus reduce a speed of the side reaction, which may degrade the battery.

For example, when a charging speed coefficient is determined based on a relatively smaller diffusion coefficient as represented by Equation 2 and an electrolyte diffusion coefficient does not affect the charging speed coefficient, the battery charging control apparatus may determine a magnitude of a current to be input to a battery having a cathode diffusion coefficient and an anode diffusion coefficient, which are shown in the graphs 410 and 420, based on the cathode diffusion coefficient when an SOC is near to 0%. In such an example, the battery charging control apparatus may also determine the magnitude of the current to be input to the battery based on the anode diffusion coefficient when an SOC is near to 100%.

Figure 5:
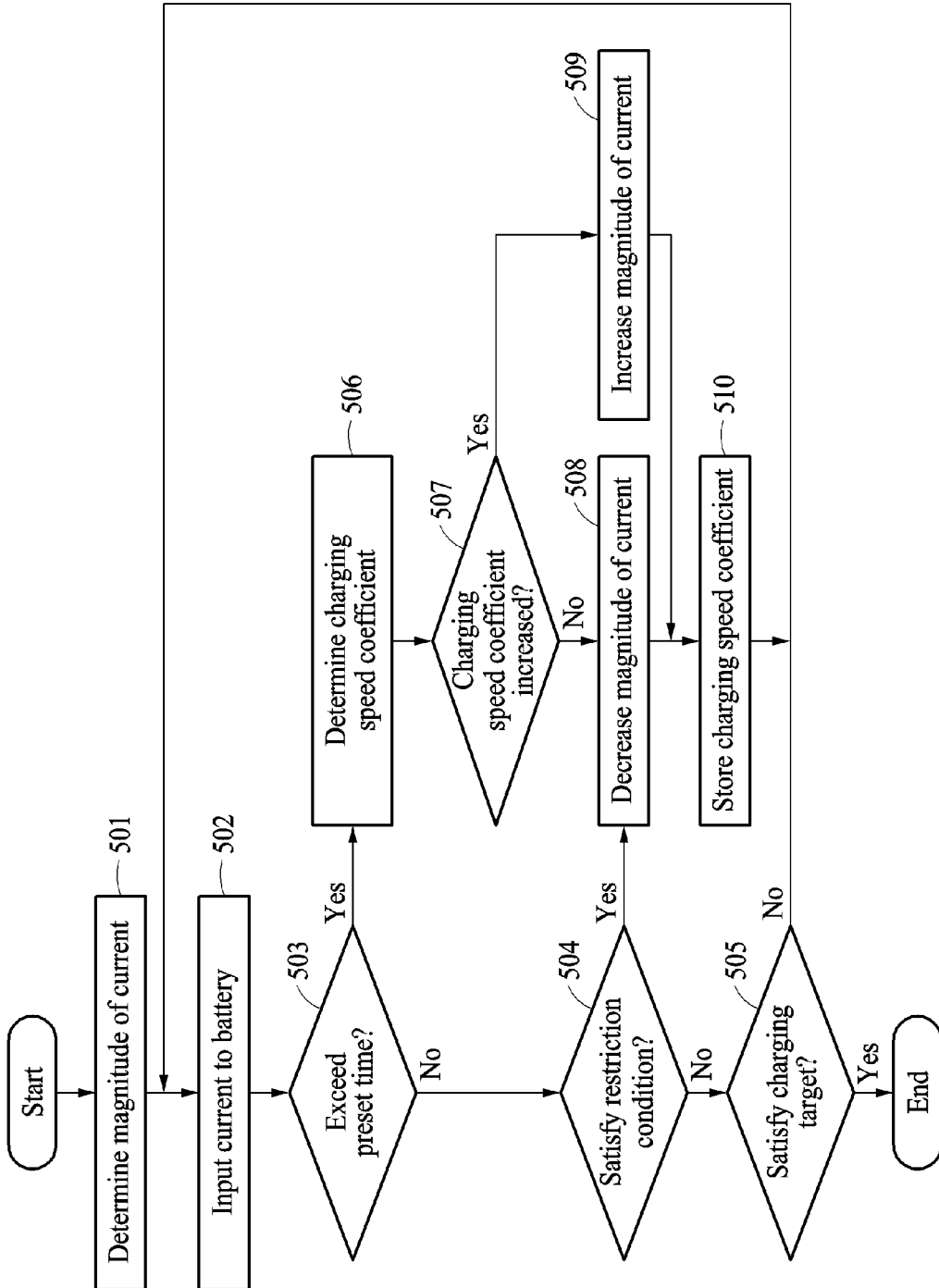
FIG. 5 is a flowchart illustrating an example of a method performed by a battery charging control apparatus to charge a battery.

FIG. 5 is a flowchart illustrating an example of a method performed by a battery charging control apparatus to charge a battery.

The operations in FIG. 5 may be performed in the sequence and manner as shown, although the order of some operations may be changed or some of the operations omitted without departing from the spirit and scope of the illustrative examples described. Many of the operations shown in FIG. 5 may be performed in parallel or concurrently. One or more blocks of FIG. 5, and combinations of blocks, can be implemented by special purpose hardware-based computer that perform the specified functions, or combinations of special purpose hardware and computer instructions.

Referring to the example of FIG. 5, in operation 501, the battery charging control apparatus determines a magnitude of a current to be input to a battery. The magnitude of the current may be determined based on an electrochemical model. The magnitude of the current may be determined based on at least one or a combination of a battery capacity, a C-rate, an SOC, or an SOH. The magnitude of the current may be determined based on a preset table, for example, a table including each SOC matching a corresponding magnitude of a current. In addition, when the magnitude of the current is maintained during a preset period of time, hereinafter referred to as a charging current maintenance time, the magnitude of the current may be determined based on the charging current maintenance time.

In operation 502, the battery charging control apparatus inputs the current to the battery. In an example, a magnitude of the current input to the battery may be equal to the magnitude of the current determined in operation 501, but is not limited thereto. The battery charging control apparatus may constantly maintain the magnitude of the current to be input to the battery during the charging current maintenance time. The battery charging control apparatus may store a charging speed coefficient at a point in time at which the battery charging control apparatus starts inputting the current to the battery.

In operation 503, the battery charging control apparatus determines whether a preset period of time, or a charging current maintenance time, has elapsed after a point in time at which the battery charging control apparatus starts inputting the current to the battery. If a determination is made that a preset period of time or a charging current maintenance time has not elapsed, then in operation 504, the battery charging control apparatus determines whether at least one of state variables of the battery that are estimated from the electrochemical model satisfies a restriction condition. In operation 505, the battery charging control apparatus determines whether an SOC of the battery satisfies a preset charging target. The charging target may be set using an SOC of the battery and the like.

In response to a determination that an SOC of the battery satisfies the charging target, for example, when the SOC is 100%, the battery charging control apparatus suspends charging the battery. For example, the battery charging control apparatus may cut off the current to be input to the battery, place the battery in an OCV state, or connect an external load to the battery. However, when both the charging target and the restriction condition are not satisfied, and the charging current maintenance time does not elapse, the battery charging control apparatus may continue inputting the current to the battery without changing the magnitude of the current.

When a time in which the magnitude of the current is input is determined to exceed the charging current maintenance time in operation 503, or it is determined that the restriction condition is satisfied from the electrochemical model in operation 504, the battery charging control apparatus may change the magnitude of the current to be input to the battery. The restriction condition may be set in relation to a concentration distribution of a material included in the battery, an overpotential distribution, or a voltage. That is, the restriction condition may include at least one of a voltage limit of the battery, a concentration limit of the material included in the battery, or an overpotential limit of the battery, that is set to prevent degradation of the battery.

In operation 506, when the time in which the magnitude of the current is input is determined to exceed the charging current maintenance time in operation 503, the battery charging control apparatus determines a charging speed coefficient at a point in time exceeding the charging current maintenance time. For example, the charging speed coefficient may be determined at the point in time exceeding the charging current maintenance time by applying Equation 1 or Equation 2 to a cathode diffusion coefficient, an anode diffusion coefficient, and an electrolyte diffusion coefficient at the point in time exceeding the charging current maintenance time. That is, the battery charging control apparatus may identify an internal diffusion characteristic of the battery that is changed in response to the current being input to the battery. The battery charging control apparatus may also identify a position in which a chemical reaction is relatively slow in the battery, or a position in which the material in the battery is relatively slowly diffused. The battery charging control apparatus may detect a distribution of a speed at which the material in the battery is diffused based on at least one of a magnitude of a current to be input to the battery, a point in time at which the current is input, or an SOC.

In operation 507, the battery charging control apparatus determines whether the charging speed coefficient determined in operation 506 increases from the charging speed coefficient before operation 502 is performed. Alternatively, the battery charging control apparatus may determine whether the charging speed coefficient determined in operation 506 increases from the charging speed coefficient at the point in time at which operation 502 is started being performed. That is, the battery charging control apparatus may determine whether the charging speed coefficient has changed.

For example, the battery charging control apparatus may compare a charging speed coefficient at the point in time at which a stored current is started being input in operation 502 and the charging speed coefficient determined in operation 506. That is, the battery charging control apparatus may compare a charging speed coefficient at a point in time at which a constant magnitude of a current is started being input and a charging speed coefficient obtained when a preset time, for example, the charging current maintenance time, elapses after the point in time. In response to a difference between the two charging speed coefficients being greater than or equal to a preset threshold, for example, a threshold that is set based on an error range, the battery charging control apparatus may determine whether the charging speed coefficient increases.

In operation 508, when the charging speed coefficient is not increased, the battery charging control apparatus decreases the magnitude of the current to be input to the battery. That is, when the charging speed coefficient has decreased compared to a charging speed coefficient at a previous point in time, the battery charging control apparatus may decrease the magnitude of the current to be input to the battery. The magnitude of the current may be decreased by a preset magnitude or may be changed to be a preset magnitude that is less than the magnitude of the current that is currently input to the battery.

In operation 508, the battery charging control apparatus decreases the magnitude of the current to be input to the battery when the restriction condition is determined to be satisfied from the electrochemical model in operation 504. For example, when at least one of a concentration distribution, an overpotential distribution, or a state variable of a voltage that is estimated from the electrochemical model satisfies the restriction condition, the battery charging control apparatus may decrease the magnitude of the current to be input to the battery.

In operation 509, when the charging speed coefficient increases, the battery charging control apparatus increases the magnitude of the current to be input to the battery. An increase in the charging speed coefficient may indicate that a speed of a chemical reaction in the battery has increased by an amount that corresponds to the charging speed coefficient. Thus, the battery charging control apparatus may increase the magnitude of the current to be input to the battery based on an increment of the charging speed coefficient.

In operation 510, the battery charging control apparatus stores the charging speed coefficient at the point in time at which the charging current maintenance time is exceeded, or at the point in time at which the restriction condition is determined to be satisfied. After storing the charging speed coefficient, the battery charging control apparatus may input a current with a magnitude that is determined in operation 508 or 509. Subsequently, when the charging current maintenance time elapses, the battery charging control apparatus may compare the charging speed coefficient stored in operation 510 and a newly calculated charging speed coefficient.

In an example, the battery charging control apparatus may determine whether to change a magnitude of a current to be input to a battery at each charging current maintenance time. To determine whether to change the magnitude of the current to be input to the battery, the battery charging control apparatus may identify a diffusion characteristic of the battery at each charging current maintenance time. The diffusion characteristic of the battery may be indicated by at least one, or a combination of, a cathode diffusion coefficient, an anode diffusion coefficient, or an electrolyte diffusion coefficient. These diffusion coefficients may be used to determine a charging speed coefficient. That is, the battery charging control apparatus may calculate a charging speed coefficient at each charging current maintenance time, and then compare calculated charging speed coefficients. Based on a result of the comparing, the battery charging control apparatus may increase or decrease the magnitude of the current to be input to the battery.

Additionally, even when a charging current maintenance time does not elapse, if a state of the battery satisfies a restriction condition that is set to prevent degradation of the battery, the battery charging control apparatus may change the magnitude of the current to be input to the battery. In such a case, the battery charging control apparatus may decrease the magnitude of the current to be input to the battery to prevent degradation of the battery. As an example, the battery charging control apparatus may store a charging speed coefficient at a point in time at which the state of the battery satisfies the restriction condition, and then input a current with a decreased magnitude to the battery during a charging current maintenance time. The charging speed coefficient at the point in time at which the restriction condition is satisfied may be compared to a charging speed coefficient obtained when the charging current maintenance time elapses, and these charging speed coefficients may be used to change the magnitude of the current to be input to the battery.

As an example, the battery charging control apparatus may charge a battery through the method described above with reference to FIG. 5, and adjust a magnitude of a current to be input to the battery based on a charging speed coefficient. The battery charging control apparatus may adjust the magnitude of the current to be input to the battery, and thus charge the battery more rapidly. That is, the battery charging control apparatus may adaptively adjust the magnitude of the current to be input to the battery, and thus charge the battery at an optimal speed while preventing degradation of the battery. Additionally, the battery charging control apparatus may directly adjust the magnitude of the current to be input to the battery as a control parameter based on a diffusion characteristic or a diffusion speed coefficient, and thus may control an SOC of the battery more precisely.

According to an example, the battery charging control apparatus may generate a charging profile of a battery based on a rule of a charging speed coefficient and a magnitude of a current to be input to the battery. The charging profile refers to information in which a time at which charging is started matches a magnitude of a current input to the battery.

Figure 6:
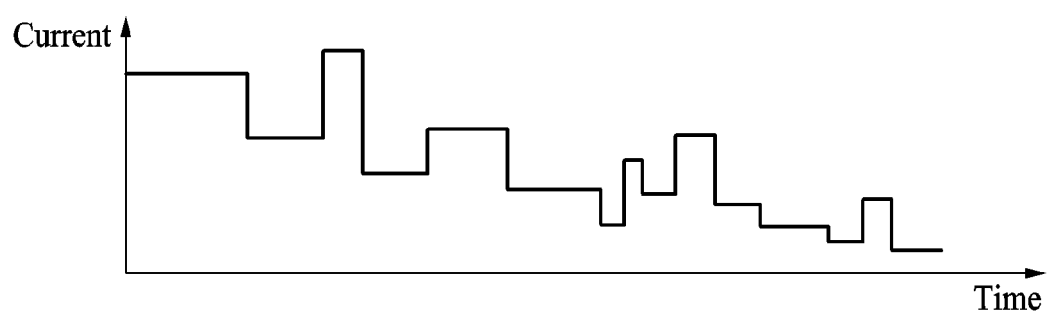
FIG. 6 is a graph illustrating an example of a charging profile generated by a battery charging control apparatus.

FIG. 6 is a graph 600 illustrating an example of a charging profile generated by a battery charging control apparatus. A charging profile may be determined based on at least one of an SOC, an SOH, or a C-rate at a point in time at which charging of a battery is started. That is, the charging profile may be generated for each SOC, each SOH, and each C-rate. The battery charging control apparatus may select, from a plurality of charging profiles, a charging profile corresponding to a current SOC, a current SOH, and a required C-rate of the battery. The battery charging control apparatus may adjust a magnitude of a current to be input to the battery according to time based on the selected charging profile.

Referring to FIG. 6, a magnitude of a current to be input to the battery is adaptively adjusted based on a charging speed coefficient. As an example, when the battery charging control apparatus charges the battery based on a charging profile, the battery charging control apparatus may charge the battery based on a distribution of chemical reaction speeds in the battery. Thus, the battery charging control apparatus may prevent degradation of the battery that may be caused by a side reaction occurring in a position in which a chemical reaction in the battery is relatively slow.

The battery charging control apparatus may be used to estimate an internal state of a battery, for example, a secondary battery, that may be charged or discharged frequently. The internal state may be, for example, a diffusion characteristic of a material included in the battery. Alternatively, the battery charging control apparatus may be used in an electronic apparatus requiring a battery charging function. The electronic apparatus may include, for example, a vehicle including a battery, but is not limited thereto.

Figure 7:
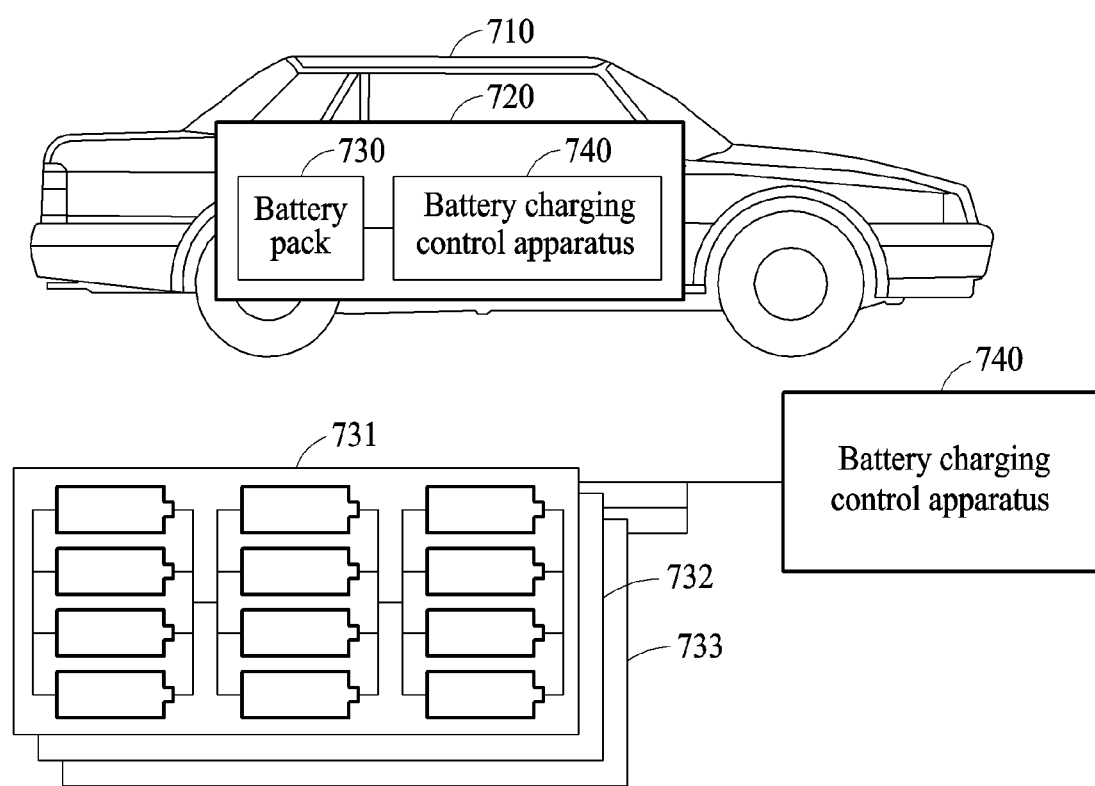
FIG. 7 is a diagram illustrating an example of a vehicle with a battery charger.

FIG. 7 is a diagram illustrating an example of a vehicle 710 including a battery system 720.

Referring to FIG. 7, the vehicle 710 includes, or is configured to include, a battery pack 730 as a power source. The vehicle 710 may be, for example, an electric vehicle (EV) or a hybrid vehicle, but is not limited to the example described in the foregoing.

The vehicle 710 includes the battery system 720. The battery system 720 includes the battery pack 730 and a battery charging control apparatus 740. The battery charging control apparatus 740 may be provided outside the battery pack 730 as illustrated. Alternatively, according to an example, the battery charging control apparatus 740 may be provided in the battery pack 730.

The battery pack 730 may include a plurality of battery modules 731, 732, and 733. Each of the battery modules 731, 732, and 733 includes one or more battery cells. The battery charging control apparatus 740 may store an electrochemical model and a charging speed coefficient that are determined based on the description provided above with reference to FIG. 2 for each of the battery cells included in the battery modules 731, 732, and 733.

While charging the battery modules 731, 732, and 733, the battery charging control apparatus 740 may perform the operations described above with reference to FIG. 5 based on the stored electrochemical model and the stored charging speed coefficient. The battery charging control apparatus 740 may determine a current to be input to each of the battery cells included in the battery modules based on an electrochemical model and a charging speed coefficient corresponding to each of the battery cells. In addition, the battery charging control apparatus 740 may estimate a state of each of the battery cells included in the battery modules 731, 732, and 733 based on the stored electrochemical model and the stored charging speed coefficient. For example, the battery charging control apparatus 740 may estimate, in real time, a diffusion characteristic of a material included in each of the battery cells.

The battery system 100, the battery charging control apparatus 110, the battery 120, the battery pack 730, the battery charging control apparatus 740 and other components described herein with respect to FIGS. 1 and 7 are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 2 and 5 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A battery charging control method comprising:
   measuring a parameter associated with the battery when the battery is being charged, the battery comprising a cathode, and anode, and an electrolyte;
   estimating a material concentration distribution within the cathode, estimating a material concentration within the anode, and estimating a material distribution within the electrolyte;
   estimating a cathode temperature distribution within the cathode, estimating an anode temperature distribution within the anode, and estimating an electrolyte temperature distribution within the electrolyte, wherein the cathode temperature distribution corresponds to positional distribution of temperature within the cathode, wherein the anode temperature distribution corresponds to positional distribution of temperature within the anode, and wherein the electrolyte distribution corresponds to positional distribution of temperature within the electrolyte, adjusting a magnitude of a current to be input to the battery based on the material concentration distributions and the temperature distributions; and charging the battery based on the adjusted magnitude of the current.

2. The battery charging control method of claim 1, wherein the parameter comprises a potential difference between the cathode and the anode, the magnitude of the current, or a magnitude of a current to be output from the battery.

3. The battery charging control method of claim 1, wherein the adjusting the magnitude of the current is based on a charging current maintenance time or a restriction condition of the battery.

4. The battery charging control method of claim 3, wherein the adjusting the magnitude of the current comprises:

determining whether a time in which a constant magnitude of a current is input is exceeds the charging current maintenance time;

in response to the time in which the constant magnitude of the current is input is determined to exceed the charging maintenance time, determining a charging speed coefficient at a point in time exceeding the charging current maintenance time based on the material concentration distributions and the positional temperature distributions; and adjusting the magnitude of the current based on the charging speed coefficient.

5. The battery charging control method of claim 4, wherein the adjusting the magnitude of the current based on the charging speed coefficient comprises:

calculating a difference between a first charging speed coefficient at a starting time in which the constant magnitude of the current is started being input to the battery and a second charging speed coefficient at the point in time exceeding the charging current maintenance time; and adjusting the magnitude of the current based on the difference.

6. The battery charging control method of claim 5, wherein the adjusting the magnitude of the current based on the difference comprises:

in response to the first charging speed coefficient being less than the second, increasing the magnitude of the current; and in response to the first charging speed coefficient being greater than the second charging speed coefficient, decreasing the magnitude of the current.

7. The battery charging control method of claim 3, wherein the adjusting the magnitude of the current comprises:

determining whether the restriction condition is satisfied; and in response to the restriction condition being determined to be satisfied, decreasing the magnitude of the current to be input to the battery.

8. The battery charging control method of claim 4, wherein the charging speed coefficient is a smaller coefficient among a cathode diffusion coefficient, an anode diffusion coefficient, and an electrolyte diffusion coefficient.

9. A battery charging control apparatus comprising:
a processor configured to:

measure a parameter associated with the battery when the battery is charged, the battery comprising a cathode, an anode, and an electrolyte, based on the parameter, estimate distributions of material concentrations within the cathode and the anode, respectively, based on the parameter, estimate positional distributions of temperature within the cathode and the anode, respectively, adjust a magnitude of a current to be input to the battery based on the distributions of the material concentrations and the positional distributions of temperatures, and charging the battery based on the adjusted magnitude of the current.

10. The battery charging control apparatus of claim 9, wherein the parameter comprises a potential difference between the cathode and the anode, the magnitude of the current, or a magnitude of a current output from the battery.

11. The battery charging control apparatus of claim 9, wherein the processor is further configured to:

adjust the magnitude of the current based on charging current maintenance time or a restriction condition of the battery.

12. The battery charging control apparatus of claim 11, wherein the processor is further configured to:

determine whether a time in which a constant magnitude of a current is input is-exceeds the charging current maintenance time, in response to the time in which the constant magnitude of the current is input is determined to exceed the charging maintenance time, determine a charging speed coefficient at a point in time exceeding the charging current maintenance time based on the material concentration distributions and the positional temperature distributions and adjust the magnitude of the current based on the charging speed coefficient.

13. The battery charging control apparatus of claim 11, wherein the processor is further configured to:

calculate a difference between a first charging speed coefficient for a time of starting charging the current with the constant magnitude and a second charging speed coefficient for a point in time exceeding a charging current maintenance time; and adjust the magnitude of the current based on the difference.

14. The battery charging control apparatus of claim 13, wherein the processor is further configured to:

in response to the first charging speed coefficient being less than the second, increase the magnitude of the current; and in response to the first charging speed coefficient being greater than the second charging speed coefficient, decrease the magnitude of the current.

15. The battery charging control apparatus of claim 11, wherein the processor is further configured to:

determine whether the restriction condition is satisfied;

in response to the restriction condition being determined to be satisfied, decrease the magnitude of the current to be input to the battery.

16. The battery charging control apparatus of claim 12, wherein the charging speed coefficient is a smaller coefficient among a cathode diffusion coefficient, an anode diffusion coefficient, and an electrolyte diffusion coefficient.

17. The battery charging control apparatus of claim 11, wherein the processor is configured to adjust the magnitude of the current based on the restriction condition, and wherein the restriction is set based on an overpotential that corresponds to degradation of the battery.

18. The battery charging apparatus of claim 17, wherein the restriction condition corresponds to accumulation of the material on a surface of the cathode or the anode and the restriction condition is determined to prevent the accumulation.

* * * * *